(12) United States Patent
Chan et al.

(10) Patent No.: US 10,079,145 B2
(45) Date of Patent: Sep. 18, 2018

(54) METHOD FOR PATTERN FORMATION ON A SUBSTRATE, ASSOCIATED SEMICONDUCTOR DEVICES, AND USES OF THE METHOD

(71) Applicants: IMEC VZW, Leuven (BE); Katholieke Universiteit Leuven, KU LEUVEN R&D, Leuven (BE)

(72) Inventors: Boon Teik Chan, Leuven (BE); Arjun Singh, Chandigarh (IN)

(73) Assignees: IMEC VZW, Leuven (BE); KATHOLIEKE UNIVERSITEIT LEUVEN, KU LEUVEN R&D, Leuven (BE)

( * ) Notice: Subject to any disclaimer, the term of this patent is extended or adjusted under 35 U.S.C. 154(b) by 8 days.

(21) Appl. No.: 15/292,328

(22) Filed: Oct. 13, 2016

(65) Prior Publication Data
US 2017/0170007 A1 Jun. 15, 2017

(30) Foreign Application Priority Data
Dec. 11, 2015 (EP) .................................... 15199468

(51) Int. Cl.
*H01L 21/47* (2006.01)
*H01L 21/027* (2006.01)
(Continued)

(52) U.S. Cl.
CPC .... *H01L 21/0273* (2013.01); *H01L 21/02356* (2013.01); *H01L 21/3085* (2013.01);
(Continued)

(58) Field of Classification Search
CPC ........... H01L 21/02356; H01L 21/0273; H01L 21/3085; H01L 21/3086; H01L 21/3088;
(Continued)

(56) References Cited

U.S. PATENT DOCUMENTS

| 7,964,107 B2 * | 6/2011 | Millward ............ B81C 1/00031 216/17 |
| 2014/0127910 A1 * | 5/2014 | Hieno ................. H01L 21/3081 438/703 |

(Continued)

*Primary Examiner* — Stephen W Smoot
(74) *Attorney, Agent, or Firm* — McDonnell Boehnen Hulbert & Berghoff LLP

(57) ABSTRACT

The present disclosure relates to a method for pattern formation on a substrate. An example embodiment includes a method for pattern formation. The method includes providing a photoresist layer on a composite substrate. The method also includes patterning the photoresist layer by lithography to define a plurality of parallel stripe photoresist structures. The method further includes providing a block copolymer on and along the composite substrate, in between the parallel stripe photoresist structures. The block copolymer includes a first component and a second component. The method additionally includes subjecting the block copolymer to predetermined conditions to cause phase separation of the first component and the second component. In addition, the method includes performing a sequential infiltration synthesis process. Still further, the method includes selectively removing the parallel stripe photoresist structures. Additionally, the method includes defining a core stripe structure. Even further, the method includes performing a self-aligned multiple patterning process.

17 Claims, 12 Drawing Sheets

(51) Int. Cl.
*H01L 29/06* (2006.01)
*H01L 21/308* (2006.01)
*H01L 21/02* (2006.01)

(52) U.S. Cl.
CPC .......... *H01L 21/3086* (2013.01); *H01L 21/47* (2013.01); *H01L 29/0692* (2013.01)

(58) Field of Classification Search
CPC ..... H01L 21/467; H01L 21/47; H01L 21/475; H01L 21/47573; H01L 29/0657; H01L 29/0692
See application file for complete search history.

(56) References Cited

U.S. PATENT DOCUMENTS

| | | | |
|---|---|---|---|
| 2014/0131839 A1* | 5/2014 | Chan | G03F 7/0002 257/618 |
| 2015/0243514 A1* | 8/2015 | Ruiz | H01L 21/3086 438/702 |
| 2015/0255271 A1* | 9/2015 | Muramatsu | H01L 21/0271 355/27 |
| 2016/0118295 A1* | 4/2016 | Chan | H01L 21/31051 438/703 |
| 2017/0162380 A1* | 6/2017 | Cheng | H01L 21/0271 |

* cited by examiner

METHOD FOR PATTERN FORMATION ON A SUBSTRATE, ASSOCIATED SEMICONDUCTOR DEVICES, AND USES OF THE METHOD

CROSS-REFERENCE TO RELATED APPLICATIONS

The present application is a non-provisional patent application claiming priority to European Patent Application No. EP 15199468.8, filed Dec. 11, 2015, the contents of which are hereby incorporated by reference.

FIELD OF THE DISCLOSURE

The present disclosure relates to method for pattern formation on a substrate, and associated semiconductor devices.

BACKGROUND

Photolithographic image formation in a photosensitive polymer layer followed by plasma-based transfer of the defined photo resist patterns into other materials has been remarkably successful in enabling the production of micro- and nanometer-scale electronic features. This has required a continuous evolution of materials and patterning techniques such as photolithography systems, photo-polymer resists, and etching equipment and processes.

For patterned structures, the critical dimension (CD) relates to the width of the patterned structures, e.g. patterned lines. The variation of the line width is expressed by the Line Width Roughness (LWR) value. The variation of the edges of the line with respect to an ideal case is expressed as Line Edge Roughness (LER). In optical lithography the following correlation is generally used between LWR and LER:

$$\sigma_{LWR} = 2^{1/2} * \sigma_{LER};$$

wherein $\sigma$ denotes standard deviation.

The manufacturing of sub-20 nm technologies has triggered a radical change in photo resist-materials; consequently, this technology has to face many new challenges such as controlling line width and line edge roughness (LWR and LER). Effects of line width roughness and line edge roughness become more important as feature dimensions become smaller, which makes the control of LWR and LER a major scaling concern. This line width roughness, defined as the $3\sigma$ critical dimension (CD) variation along a segment of a line, is having a big impact on the transistor performance. In addition, increased LWR also induces higher variance in device performance which can affect circuit stability. Given the 10% gate CD criterion, devices fabricated with the 20 nm node technology are required to have a maximum allowable LWR which is smaller than or equal to 2 nm, or even smaller than or equal to 1 nm. The current best LWR that can be achieved in photo resist using EUV lithography is about 3 to 4 nm. A substantial improvement in LWR of the patterned structures is required to minimize the impact on device performance.

Self-Aligned Double (or Multiple) Patterning (SAD(M)P) using 193 nm immersion lithography also suffer from high LWR and LER values after lithography development.

A plasma treatment may be applied using HBr or $H_2$ plasma on patterned photo resist features for smoothening of these photo resist features in an effort to reduce LWR/LER. However, this approach introduces an additional plasma step into the process flow.

There exists a need for novel techniques which allow to further reduce LWR and LER, especially for sub-20 nm technologies.

SUMMARY

It is an aim of the present disclosure to provide a method for pattern formation on a substrate, which allows reducing LWR and LER of patterned structures, especially for sub-20 nm technologies.

This aim is achieved according to the disclosure with the method showing the technical characteristics of the first independent claim.

Associated devices and uses of the method are also disclosed.

In a first aspect of the present disclosure, a method for pattern formation is disclosed, comprising:
  providing a photo resist layer on a composite substrate;
  patterning the photo resist layer by lithography to thereby define a plurality of parallel stripe photo resist structures;
  providing a block copolymer on and along the substrate, in between the parallel stripe photo resist structures, the block copolymer comprising a first component and a second component;
  subjecting the block copolymer to predetermined conditions as to cause phase separation of the first component and the second component along the composite substrate;
  wherein the block copolymer and the predetermined conditions are predetermined such that a lamellar structure is formed comprising at a central position in between two adjacent parallel stripe photo resist structures a single mandrel structure of the first component, the single mandrel structure being separated from the two adjacent parallel stripe photo resist structures by parallel stripe structures of the second component; and
  performing a sequential infiltration synthesis (SIS) process on the mandrel structure of the first component (e.g. hereby synthesizing a metallic compound selectively in the mandrel structure of the first component);
  selectively removing the parallel stripe photo resist structures and the parallel stripe structures of the second component;
  defining a core stripe structure in a core layer present in the composite substrate by using the mandrel structure of the first component as a mask;
  performing a self-aligned multiple patterning (SAMP) process hereby using the core stripe structure as a core.

A block co-polymer refers to a polymer comprising two or more chemically different polymer blocks (or can be named as "components") covalently bonded to each other. A block co-polymer with two different polymer blocks is called a "di-block co-polymer". A block co-polymer with three different polymer blocks is called a "tri-block co-polymer".

The second polymer component of the block co-polymer may absorb part of the poor LWR/LER that results from a photo resist lithography process.

Moreover, in some embodiments, the sequential infiltration synthesis process further reduces the LWR/LER.

In some embodiments, the LWR and LER of patterned structures can be reduced, for instance to a LWR smaller than 2 nm, and with a small LER of less than 3 nm, or even to a LWR and LER both being less than 1 nm.

In some embodiments, the composite substrate comprises a base silicon wafer or substrate and a stack of layers produced thereon by semiconductor processing.

The skilled person appreciates that in a SIS process organo-metallic (OM) precursor vapors and oxidants are sequentially introduced into self-assembled block copolymer systems in multiple cycles. The OM precursor is chosen to ensure selective reaction with only one of the copolymer blocks in the BCP. The unmodified BCP block is subsequently etched away. Thus, the polymer pattern is transformed into a metallic mask with much enhanced plasma etch contrast.

According to various embodiments, the composite substrate comprises a plurality of layers, the plurality of layers comprising a core layer on an underlying substrate layer; and a hard mask layer on top of the core layer, and using the mandrel structure of the first component as a mask for defining a core stripe structure in the core layer comprises transferring the mandrel structure of the first component into the hard mask layer, selectively removing the mandrel structure, and transferring a resulting pattern of the hard mask layer into the core layer.

According to various embodiments, the method further comprises providing a neutral layer on the hard mask layer, and transferring the mandrel structure of the first component into the hard mask layer comprises transferring the mandrel structure of the first component into the neutral layer, and further comprises removing the neutral layer before transferring the resulting pattern of the hard mask layer into the core layer.

The neutral layer can be a random copolymer brush or cross-linking mat where the copolymer components are the same as those in the BCP material. For example, PS-r-PMMA neutral layer can be used for a PS-b-PMMA BCP layer. Alternatively, a hard mask material with surface energy which is non-preferential to the BCP may be used.

In some embodiments, the substrate layer, core layer, hard mask layer and, if present, the neutral layer are in direct physical contact, i.e. are directly interfacing each other in the layer stack.

In some embodiments, the photo resist layer is provided in physical contact with the hard mask layer or neutral layer.

According to various embodiments, the neutral layer is provided on the hard mask layer before providing the photo resist layer.

According to various embodiments, the neutral layer is provided on the hard mask layer after providing the photo resist layer.

According to various embodiments, patterning the photo resist layer by lithography comprises patterning the photo resist layer by deep UV lithography, extreme UV lithography (EUV), or (e.g. 193 nm) immersion lithography.

According to various embodiments, the SAMP process is a self-aligned double patterning (SADP), self-aligned triple patterning (SATP), self-aligned octuplet patterning (SAOP) or self-aligned quadruple patterning (SAQP) process. In some embodiments, the SAMP process is a self-aligned double patterning (SADP) process.

According to various embodiments, performing the SAMP (or SADP) process comprises:
  providing spacer structures at the sidewalls of the core stripe structure;
  selectively removing the core stripe structure;
  patterning an underlying layer by using the spacer structures as a mask (e.g. positioned lower in the substrate, e.g. a layer positioned below, e.g. positioned directly below).

According to various embodiments, the mandrel structure is embedded by parallel stripe structures of the second component. A parallel stripe structure of the second component can be present on either side of the mandrel structure, in between the mandrel structure and the respective adjacent parallel stripe photo resist structure.

According to various embodiments, the mandrel structure is box-shaped.

Alternatively, the mandrel structure has a substantially cylindrical shape. The cylindrically-shaped, core-defining stripe structure can be embedded in the second component. The stripe structure can, for instance, be located centrally in the space between two adjacent parallel stripe photo resist structures. The second component is then typically also present under and above the mandrel structures, after subjecting the block copolymer to predetermined conditions as to cause phase separation of the first component and the second component along the substrate. A SIS process may for instance be applied which penetrates the second component but affects only the first component.

According to various embodiments, spacing between two adjacent parallel stripe photo resist structures is smaller than 40 nm, and the block-copolymer has a natural periodicity within the range of 10 nm to 50 nm (e.g. between 20 nm and 30 nm).

According to various embodiments, the first component of the BCP, i.e. the mandrel structure has a relatively high removal (e.g. etch removal; for a predetermined selective removal process) resistance with respect to the second component, i.e. the parallel stripe structures, especially after the SIS process.

According to various embodiments, the block copolymer comprises or consists of PS-b-PMMA, wherein PMMA is the first component and PS is the second component. Alternatively, the block copolymer comprises e.g. PS-b-P2VP or PS-b-P4VP.

According to various embodiments, the block copolymer has a natural periodicity, referred to as $L_0$, which is equal or approximately equal to halve (0.5×) the photoresist pattern pitch. For instance, $L_0$ can be within the range of 95%-105%, or within a range of 99%-101%, or within the range of 99.9% to 100.1% of the photoresist pattern pitch.

According to various embodiments, the block copolymer has a natural periodicity, referred to as $L_0$, between 20 and 30 nm.

According to various embodiments, the method further comprises trimming the core stripe structure before performing the self-aligned multiple (or double) patterning process.

According to a second aspect of the present disclosure, a semiconductor device is disclosed, comprising processed stripe or line features having a line width roughness smaller than 3 nm, or smaller than 2 nm, or smaller than 1 nm.

According to various embodiments, the semiconductor device comprises processed stripe or line features having a line edge roughness smaller than 3 nm, or smaller than 2 nm, or smaller than 1 nm, the stripe or line features or structures being processed by semiconductor processing techniques (as opposed to natural material features having such properties).

According to a third aspect of the present disclosure, the use of the method of the first aspect is disclosed for defining geometrical features in a Back-end-of-line (BEOL) structure of a semiconductor device. It can for instance be used for defining metal interconnect lines with reduced LWR/LER.

According to a fourth aspect of the present disclosure, the use of the method of the first aspect is disclosed for defining geometrical features in a Front-end-of-line (FEOL) structure of a semiconductor device. It can for instance be used for defining Fin or gate structures (lines or striped) with reduced LWR/LER. According to various embodiments, the processed stripe or line features correspond to fin structures of a semiconductor transistor device.

BRIEF DESCRIPTION OF THE FIGURES

The disclosure will be further elucidated by the following description and the appended figures.

DETAILED DESCRIPTION

Figure 1:
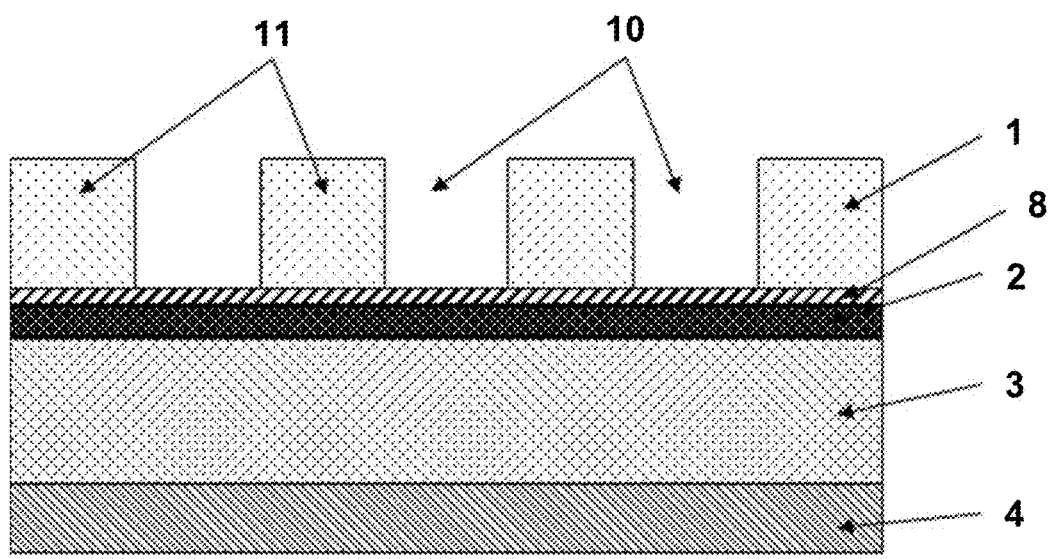
FIG. 1 illustrates a process flow, according to example embodiments.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Furthermore, the various embodiments are to be construed as examples of manners in which the disclosure may be implemented rather than as limiting the scope of the disclosure.

An example embodiment is described now in relation with FIGS. 1 to 11. A composite substrate (2, 3, 4), (8, 2, 3, 4) is provided, which is for instance a layered substrate. The composite substrate can be a partially processed substrate.

The composite substrate can for instance comprise a TiN, amorphous silicon (a-Si), $SiO_2$, $Si_3N_4$, SiON, SiOC, SiCO, SiCN, etc. substrate layer or substrate 4, for instance provided on a silicon or other semiconductor material wafer or base substrate. Alternatively, the substrate layer can comprise or consist of AlN, spin-coated TiO or WO or ZrO metal hard mask.

On top of the substrate 4 a core layer 3 can be provided/present, which is to be patterned into core structures, to be used finally as cores for a self-aligned multiple patterning (SAMP) process.

The core layer 3 can for instance comprise an Advanced Patterning Film (APF), Organic Patterning Layer (OPL) or Spin on Carbon (SoC) layer. On top of the core layer 3 a dielectric hard mask layer 2 can be present/provided.

Other layers can be present in between the substrate layer 4 and the base substrate. These layers may constitute layers part of a FEOL or BEOL of a processed semiconductor wafer.

The dielectric hard mask layer 2 can for instance comprise or consist of for instance one or more of $SiO_2$, SiON, SiOC, $Si_3N_4$ or spin on glass (SoG).

In the embodiment depicted in FIG. 1, a neutral layer 8 (such as for instance an hydroxyl-terminated poly(styrene-random-methylmethacrylate) [PS-r-PMMA-OH] brush) is provided/present on top of the dielectric hard mask layer 2.

The neutral layer 8 can for instance comprise or consist of PS-r-PMMA and can be for instance an hydroxyl-terminated poly(styrene-random-methylmethacrylate) [PS-r-PMMA-OH] brush layer.

A photo resist layer is then provided on the neutral layer 8. The photo resist layer 1 is patterned by lithography (for instance by UV, extreme UV lithography (EUV) or (e.g. 193 nm) immersion lithography) to thereby define a plurality of parallel stripe photo resist structures 11, separated from one another by trenches 10 (FIG. 1).

Alternatively, the photo resist layer is provided directly on the dielectric hard mask layer 2, and patterned into a plurality of parallel stripe photo resist structures. Thereafter a neutral layer 8 can be provided on the hard mask layer 2, in between the plurality of parallel stripe photo resist structures (not depicted).

Figure 2:
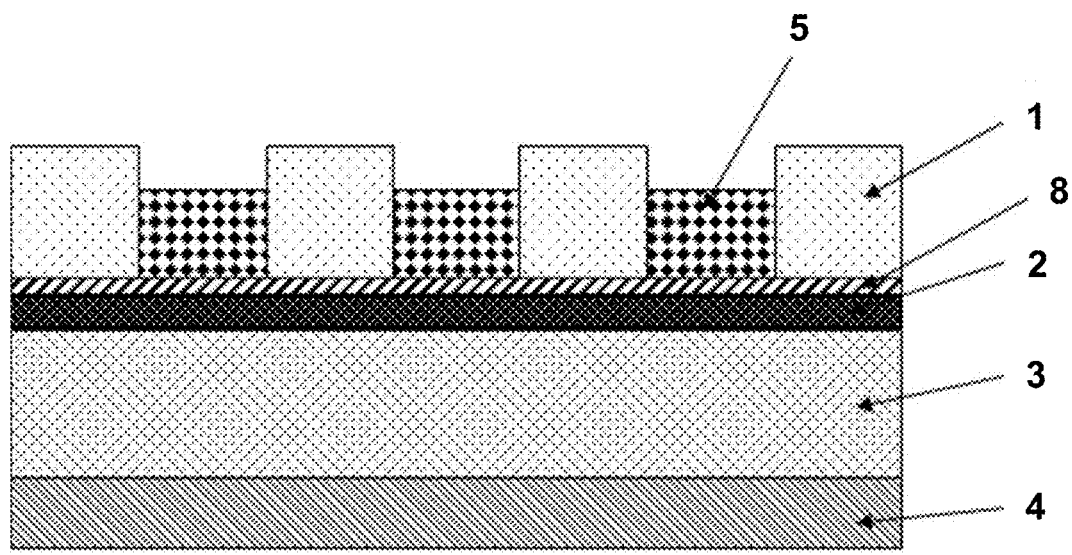
FIG. 2 illustrates a process flow, according to example embodiments.

A block copolymer 5, for instance a block copolymer in a solution is now provided in the trenches in between the parallel stripe photo resist structures, on and along the composite substrate (e.g. on and along the neutral layer 8), the block copolymer comprising a first polymer based component and a second polymer based component (FIG. 2). Any suitable block copolymer system can be used, as far as it results in the effects described below. For instance, a PS-b-PMMA block copolymer can be used. Suitable options of the block copolymer and tuning of its parameters is supposed to be known to the skilled person in order to achieve the effects described below. Hereby, the trenches 10 in between the parallel stripe photo resist structures 11, which are abutting on the neutral layer or dielectric hard mask layer 2, are filled up until a level in between 50% and 100% of the height of the trenches. In some embodiments, no overfilling will occur (more than 100% filling). Further, in some embodiments no under filling will occur (less than 50% filling). The block copolymer 5 can for instance be applied by a spin coating process.

Figure 3:
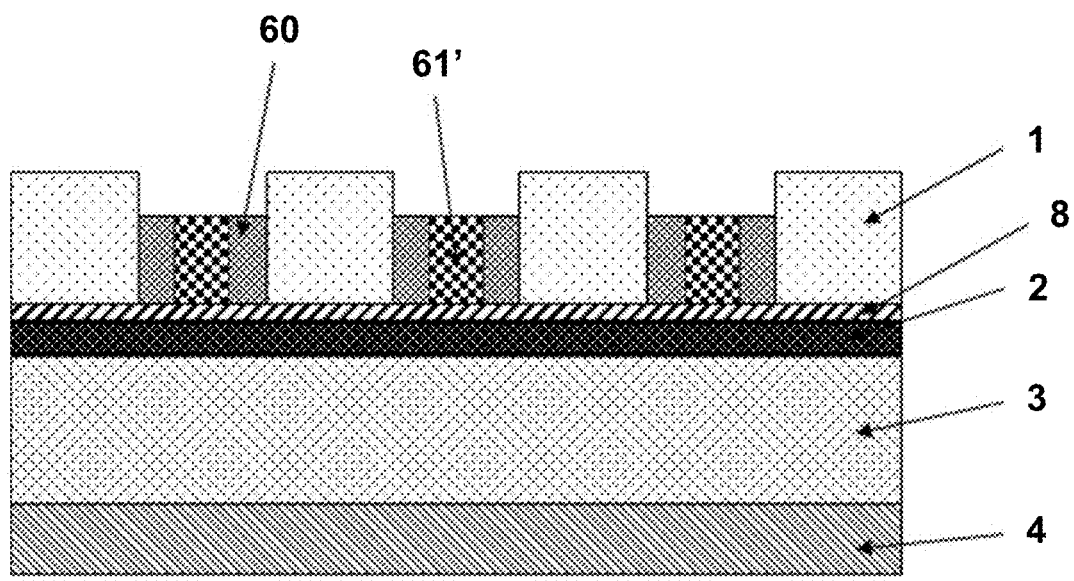
FIG. 3 illustrates a process flow, according to example embodiments.

The block copolymer is subjected to predetermined conditions (for instance a temperature step (anneal step)) as to cause phase separation of the first component (structures 61; e.g. PMMA) and the second component (structures 60; e.g. PS) (FIG. 3). The photo resist structures are hereby used as a template for grapho-epitaxy block-copolymer assembly.

Hereby the block copolymer and the predetermined conditions are predetermined such that at a central position in between two adjacent parallel stripe photo resist structures, a mandrel structure 61 is formed of the first component, the mandrel structure 61 being separated from the two adjacent parallel stripe photo resist structures 11 by parallel stripe structures 60 of the second component. The mandrel structure 61 may be box-shaped, the mandrel structure 61 being embedded in the second component material 60. It can for instance be located in the center of the space between two adjacent parallel stripe photo resist structures 11.

Alternatively, the mandrel can also have a cylindrical shape.

Figure 4:
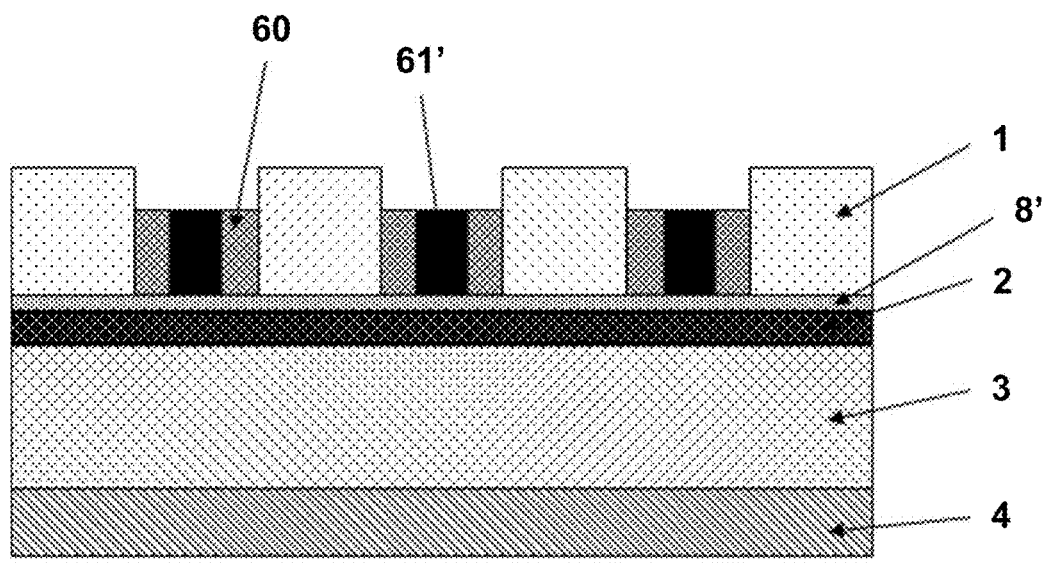
FIG. 4 illustrates a process flow, according to example embodiments.

Then a sequential infiltration synthesis (SIS) process is performed to synthesize a metallic compound selectively in the mandrel structure of the first component 61, resulting in a metal comprising mandrel structure 61'. For instance, $AlO_x$ (but for instance also ZnO, W, TiN, $TiO_2$, AlN, $SiO_2$) can be infused by the SIS process in the mandrel structure 61, as is known to the skilled person. Precursors and materials are chosen such as to obtain an optimized selectivity of the infiltration process. The SIS process typically may hereby also synthetize at least partially in the neutral layer 8 if present, resulting in a metal comprising (e.g. $AlO_x$ infused) neutral layer 8' (FIG. 4).

This results in a better selectivity of the subsequent selective removal process for the structures of the second component 60 and photo resist structures 11 with respect to the mandrel structures 61'. Hereby the LWR and LER of the mandrel structures 61' is substantially improved when compared to a process wherein no SIS process is performed.

Figure 5:
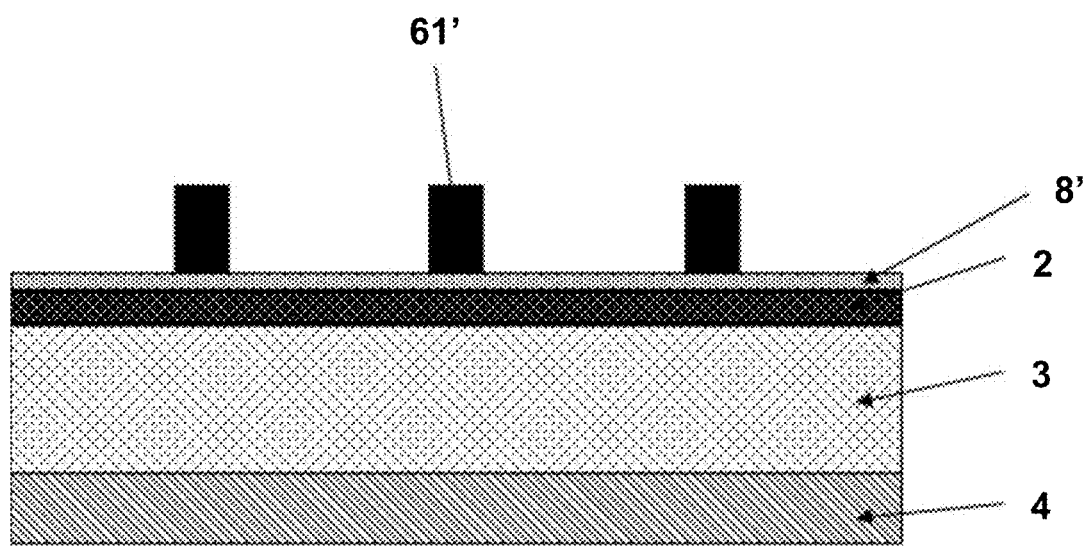
FIG. 5 illustrates a process flow, according to example embodiments.

Then, the parallel stripe photo resist structures (11) are selectively removed as well as the parallel stripe structures (60) of the second component (FIG. 5). For instance, an plasma (e.g. $Ar/O_2$ plasma, $N_2/H_2$ plasma, $Ar/H_2$ plasma, $SO_2$ plasma/$CH_3F$/Ar plasma or $Ar/H_2/CH_3F$ plasma) can be used to selectively remove the second component of the block-copolymer. The guiding photo resist (parallel stripe photo resist structures 11) will for instance be consumed at the same time if an over-etch with an $Ar/O_2$ plasma is applied. After this $Ar/O_2$ plasma treatment, the first polymer component 61' of the block co-polymer can be used further to pattern the hard mask layer (2) and the underlying layer (3).

Figure 6:
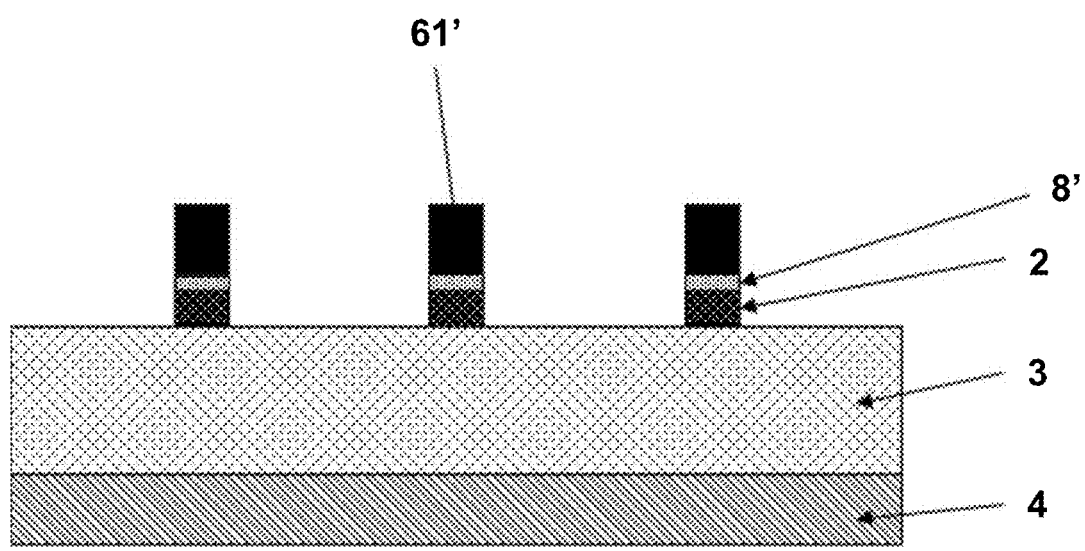
FIG. 6 illustrates a process flow, according to example embodiments.
Figure 7:
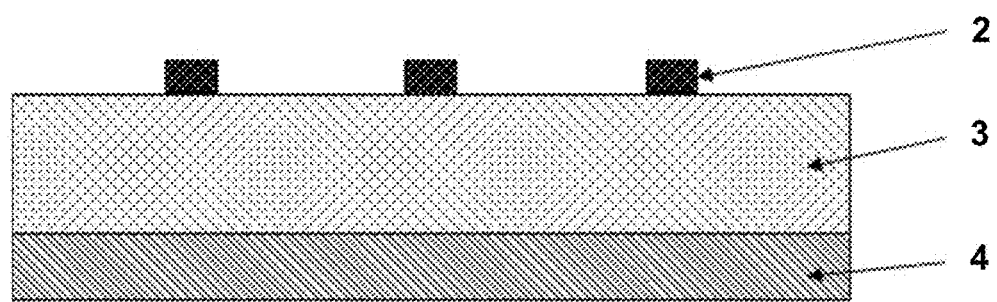
FIG. 7 illustrates a process flow, according to example embodiments.
Figure 8:
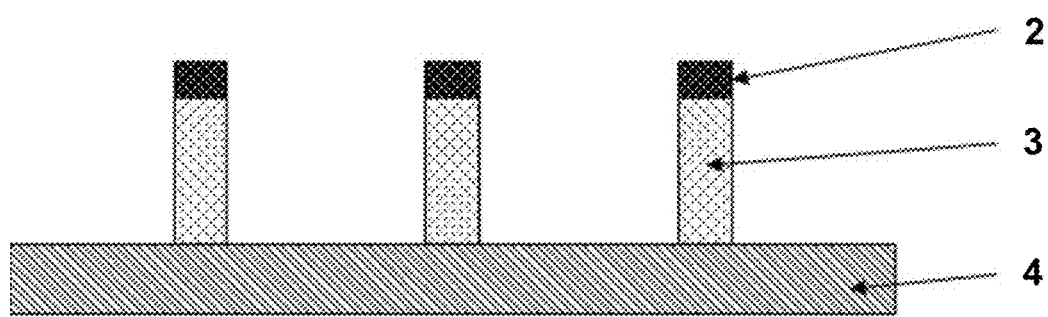
FIG. 8 illustrates a process flow, according to example embodiments.

The remaining mandrel structure 61' of the first component is then used as a mask for defining a core stripe structure in a core layer present in the substrate, for instance in the APF film 3 or SoC layer 3. In a first step the pattern defined by the mandrel structures 61' of the first component can for instance be transferred in the underlying neutral layer 8' (if present) and dielectric hard mask 2 (FIG. 6). Hereby, or hereafter, the mandrel structures 61', and the neutral layer 8' if present, can be selectively removed (FIG. 7). Thereafter, or in a common process, the pattern in the dielectric hard mask 2 may be transferred in the underlying APF film or SoC layer 3 (FIG. 8).

Figure 9:
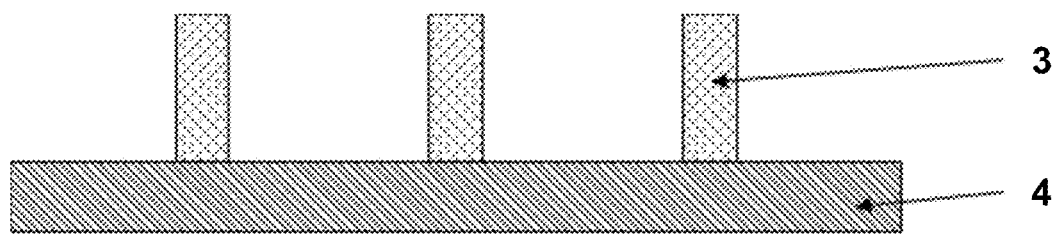
FIG. 9 illustrates a process flow, according to example embodiments.
Figure 10:
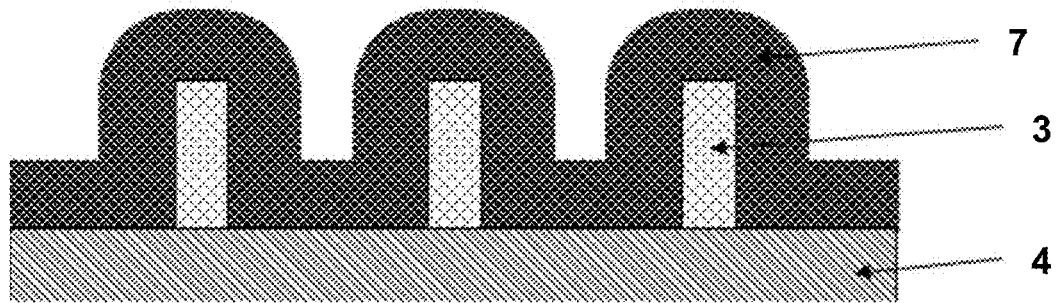
FIG. 10 illustrates a process flow, according to example embodiments.
Figure 11A:
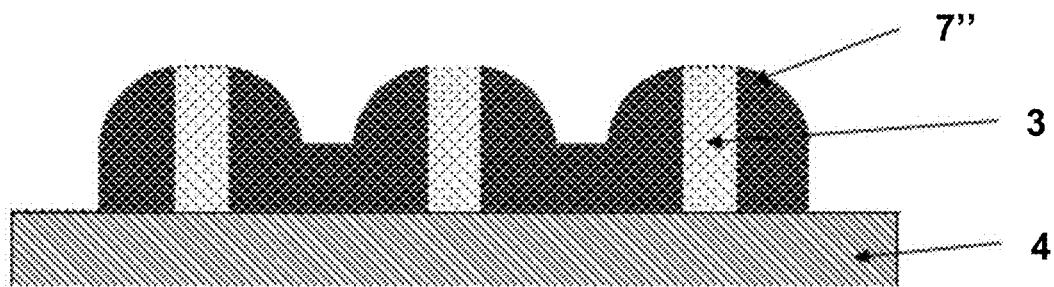
FIG. 11a illustrates a process flow, according to example embodiments.
Figure 11B:
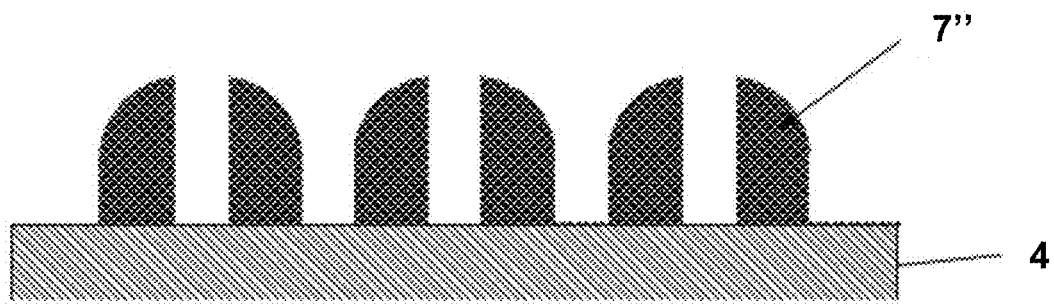
FIG. 11b illustrates a process flow, according to example embodiments.

The remaining portion of the dielectric hard mask layer 2 is then removed, for instance by an HF solution (FIG. 9). The core stripe structure in layer 3, having a very small LWR and LER, can then be used for performing a self-aligned multiple patterning (SMDP), e.g. a SADP, process hereby using the core stripe structure 3 as a core. A first step of providing a spacer layer 7 over the core structures is depicted in FIG. 10. The spacer layer can for instance comprise $Si_3N_4$, $SiO_2$, $AlO_x$, and other suitable spacer materials. The spacer layer thickness is then reduced anisotropically in order to provide patterned spacer structures 7" adjacent to exposed core stripe structures 3 (FIG. 11a). After this process the different patterned spaced structures 7" are separated from one another, i.e. in between the spacer structures 7" no spacer layer material is left over. The core stripe structures 3 are then removed in a further step (FIG. 11b), followed by further SADP process steps known to the skilled person.

According to certain embodiments, if appropriate, the core stripe structure may also be trimmed before they are used in the SAMP/SADP process.

The DSA process of the block-copolymer PS-b-PMMA can provide a low value of line width roughness (LWR) and line edge roughness (LER) for the PMMA lines/structures after the SIS process and PS etch.

Figure 12:
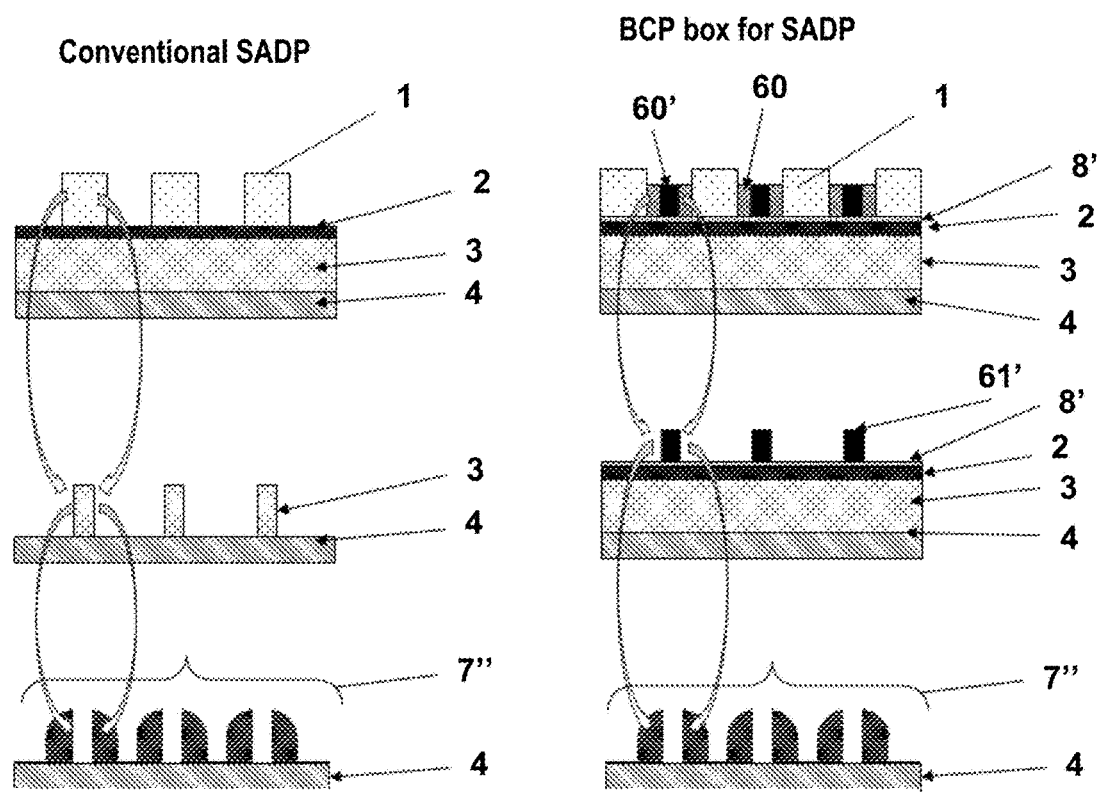
FIG. 12 provides a comparison of alternative methods and a method according to example embodiments.

In a certain view, aspects of the present disclosure may permit relatively low LWR and low LER by using block-copolymer material, with or without plasma treatment on patterned photo resist features. Plasma treatment of patterned photo resist features is a way of smoothing these features, thereby reducing LWR/LER of the structures to be formed. The proposed combination of DSA/SADP minimizes the LWR/LER value at the initial stage prior to any further pattern transfer into hard mask or silicon substrate. This and other features are illustrated in FIG. 12, which shows on the left side a conventional SADP process, and on the right side a process according to embodiments of the present disclosure. In some embodiments, the use of the block-copolymer and SIS process can substantially compensate the intrinsically poor LWR/LER resulting from the photo resist lithography process. Further, a SIS process can be performed at relatively low temperatures, e.g. at temperatures below 100° C.

In some embodiments, a core trim or core shrink process, which is sometimes used in SAMP/SADP processes, is not needed in order to obtain the LER/LWR.

What is claimed is:
1. A method for pattern formation, comprising:
providing a photoresist layer on a composite substrate;
patterning the photoresist layer by lithography to thereby define a plurality of parallel stripe photoresist structures;
providing a block copolymer on and along the composite substrate, in between the parallel stripe photoresist structures, wherein the block copolymer comprises a first component and a second component;
subjecting the block copolymer to predetermined conditions to cause phase separation of the first component and the second component along the composite substrate, wherein the block copolymer and the predetermined conditions are predetermined such that a lamellar structure is formed that comprises, at a central position in between two adjacent parallel stripe photoresist structures, a single mandrel structure of the first component, and wherein the single mandrel structure is separated from the two adjacent parallel stripe photoresist structures by parallel stripe structures of the second component;
performing a sequential infiltration synthesis process on the single mandrel structure of the first component;
selectively removing the parallel stripe photoresist structures and the parallel stripe structures of the second component;
defining a core stripe structure in a core layer present in the composite substrate using the single mandrel structure of the first component as a mask; and
performing a self-aligned multiple patterning (SAMP) process hereby using the core stripe structure as a core.
2. The method according to claim 1,
wherein the composite substrate comprises a plurality of layers, wherein the plurality of layers comprises the core layer on an underlying substrate layer and a hardmask layer on top of the core layer on the underlying substrate layer, and wherein defining the core stripe structure in the core layer present in the composite substrate using the single mandrel structure of the first component as the mask comprises:

transferring the single mandrel structure of the first component into the hardmask layer;

selectively removing the single mandrel structure; and transferring a resulting pattern of the hardmask layer into the core layer present in the composite substrate.

3. The method according to claim 2, further comprising:
providing a neutral layer on the hardmask layer, wherein transferring the single mandrel structure of the first component into the hardmask layer comprises transferring the single mandrel structure of the first component into the neutral layer; and removing the neutral layer before transferring the resulting pattern of the hardmask layer into the core layer.

4. The method according to claim 3, wherein the neutral layer is provided on the hardmask layer before providing the photoresist layer.

5. The method according to claim 3, wherein the neutral layer is provided on the hardmask layer after providing the photoresist layer.

6. The method according to claim 1, wherein the SAMP process is a self-aligned double patterning (SADP) process, and wherein performing the SADP process comprises:

providing spacer structures at sidewalls of the core stripe structure;

selectively removing the core stripe structure; and patterning an underlying layer by using the spacer structures as a mask.

7. The method according to claim 1, wherein the single mandrel structure is a rectangular box.

8. The method according to claim 1, wherein a spacing between two adjacent parallel stripe photoresist structures is smaller than 50 nm, and wherein the block copolymer has a natural periodicity within a range of 20 nm to 50 nm.

9. The method according to claim 1, wherein the block copolymer comprises polystyrene-block-poly(methyl methacrylate) (PS-b-PMMA).

10. The method according to claim 1, further comprising trimming the core stripe structure before performing a self-aligned double multiple patterning (SADP) process.

11. The method according to claim 1, wherein the method defines geometrical features in a Back End of Line structure of a semiconductor device.

12. A method for defining geometrical features in a Front End Of Line structure of a semiconductor device, comprising:

providing a photoresist layer on a composite substrate;

patterning the photoresist layer by lithography to thereby define a plurality of parallel stripe photoresist structures;

providing a block copolymer on and along the composite substrate, in between the parallel stripe photoresist structures, wherein the block copolymer comprises a first component and a second component;

subjecting the block copolymer to predetermined conditions to cause phase separation of the first component and the second component along the composite substrate, wherein the block copolymer and the predetermined conditions are predetermined such that a lamellar structure is formed that comprises, at a central position in between two adjacent parallel stripe photoresist structures, a single mandrel structure of the first component, and wherein the single mandrel structure is separated from the two adjacent parallel stripe photoresist structures by parallel stripe structures of the second component;

performing a sequential infiltration synthesis process on the single mandrel structure of the first component;

selectively removing the parallel stripe photoresist structures and the parallel stripe structures of the second component;

defining a core stripe structure in a core layer present in the composite substrate using the single mandrel structure of the first component as a mask; and performing a self-aligned multiple patterning (SAMP) process hereby using the core stripe structure as a core.

13. The method according to claim 12,
wherein the composite substrate comprises a plurality of layers, wherein the plurality of layers comprises the core layer on an underlying substrate layer and a hardmask layer on top of the core layer on the underlying substrate layer, and wherein defining the core stripe structure in the core layer present in the composite substrate using the single mandrel structure of the first component as the mask comprises:

transferring the single mandrel structure of the first component into the hardmask layer;

selectively removing the single mandrel structure; and transferring a resulting pattern of the hardmask layer into the core layer present in the composite substrate.

14. The method according to claim 13, further comprising:

providing a neutral layer on the hardmask layer, wherein transferring the single mandrel structure of the first component into the hardmask layer comprises transferring the single mandrel structure of the first component into the neutral layer; and removing the neutral layer before transferring the resulting pattern of the hardmask layer into the core layer.

15. The method according to claim 14, wherein the neutral layer is provided on the hardmask layer before providing the photoresist layer.

16. The method according to claim 14, wherein the neutral layer is provided on the hardmask layer after providing the photoresist layer.

17. The method according to claim 12, wherein the SAMP process is a self-aligned double patterning (SADP) process, and wherein performing the SADP process comprises:

providing spacer structures at sidewalls of the core stripe structure;

selectively removing the core stripe structure; and patterning an underlying layer by using the spacer structures as a mask.

* * * * *